(12) United States Patent
Yamaguchi

(10) Patent No.: US 6,337,175 B1
(45) Date of Patent: Jan. 8, 2002

(54) METHOD FOR FORMING RESIST PATTERN

(75) Inventor: Atsumi Yamaguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/413,723

(22) Filed: Oct. 7, 1999

(30) Foreign Application Priority Data

May 6, 1999 (JP) .......................................... P11-125617

(51) Int. Cl.[7] .................................................. G03F 7/30
(52) U.S. Cl. ........................ 430/322; 430/394; 430/313
(58) Field of Search ................................ 430/322, 313, 430/312, 394, 325

(56) References Cited

U.S. PATENT DOCUMENTS

| | | | | | |
|---|---|---|---|---|---|
| 4,123,272 A | * | 10/1978 | Quinn | ........................ | 96/35.1 |
| 5,707,783 A | * | 1/1998 | Stauffer et al. | ............. | 430/313 |
| 5,858,620 A | * | 1/1999 | Ishibashi et al. | ............ | 430/313 |
| 5,905,019 A | * | 5/1999 | Obszarny | .................... | 430/327 |
| 5,981,149 A | | 11/1999 | Yamaguchi | | |
| 6,200,726 B1 | * | 3/2001 | Chen et al. | .............. | 430/270.1 |
| 6,274,289 B1 | * | 8/2001 | Subramanian et al. | ... | 430/273.1 |

FOREIGN PATENT DOCUMENTS

| | | | |
|---|---|---|---|
| JP | 406250379 | * | 9/1994 |
| JP | 8-17703 | | 1/1996 |

\* cited by examiner

*Primary Examiner*—Janet Baxter
*Assistant Examiner*—Yvette M. Clarke
(74) *Attorney, Agent, or Firm*—Oblon, Spivak, McClelland, Maier & Neustadt, P.C.

(57) ABSTRACT

An object is to enhance focus latitude and to suppress variations of widths due to different intervals in a resist pattern. A positive resist is applied on a substrate (1) and then a first exposure is performed to provide a resist pattern (2a) patterned into lines arranged at equal widths and equal intervals. Subsequently, a resin (6) containing an acid generator is applied on the substrate (1) to cover the resist pattern (2a). Next, a second exposure is performed with a photomask (5) to remove part of the resist pattern (2a).

12 Claims, 12 Drawing Sheets

METHOD FOR FORMING RESIST PATTERN

BACKGROUND OF THE INVENTION

1. Field of the Invention

The present invention relates to a method for forming resist patterns suited for applications to wiring pattern formation with widths and intervals of a quarter micron (0.25μm) or smaller.

2. Description of the Background Art

In processes for manufacturing semiconductor integrated circuits (semiconductor devices), various treatments, such as etching and ion implantation, are selectively applied to semiconductor substrates (including not only unprocessed semiconductor substrates but also those already processed or treated in the semiconductor process sequence). In the processes, in order to selectively protect the semiconductor substrate as an underlying layer to be processed, a coating of compound sensitive to radiation such as ultraviolet rays, X-rays, electron beam, etc., i.e. a photosensitive resist (hereinafter referred to as resist), is formed on the substrate and then it is patterned by exposure using the radiation (which means exposure not only to visible light but also to various radiations such as ultraviolet rays, electron beam, etc.). That is to say, a resist pattern is formed on the semiconductor substrate through photolithography process.

In the most generally used method for forming resist patterns, exposure is carried out by using a reduction projection exposure system (stepper) using g-line (wavelength=436 nm) or i-line (wavelength=365 nm) of a mercury lamp, or a KrF excimer laser (wavelength=248 nm) as a light source. In such exposure, a photomask is attached to the stepper. The photomask is also called reticle, in which patterns to be transferred (e.g. wiring patterns) are drawn as mask patterns on a glass substrate with shielding film made of chromium (Cr), for example. In the exposure, the photomask and circuit patterns already formed on the semiconductor substrate are precisely positioned (aligned).

The mask pattern drawn on the photomask is projected by light emitted from the light source (not only visible light but also ultraviolet radiation etc. are referred to as 'light' in this specification), and the projected rays pass through a lens provided in the stepper. Thus the mask pattern is transferred onto the resist applied on the semiconductor substrate on a reduced scale. Subsequently, the resist is developed to form a resist pattern. The resist includes positive type and negative type. In positive resists, irradiated areas dissolve in a developer and unirradiated areas do not dissolve. In negative resists, irradiated areas do not dissolve in a developer and unirradiated areas dissolve.

In the semiconductor processes, the process of forming resist pattern is usually carried out twenty to thirty times. Recent progresses for higher integration and higher performance of semiconductor integrated circuits require further miniaturization of the circuit patterns. For example, in the case of DRAMs (Dynamic Random Access Memories), 0.25 to 0.20 μm resist patterns are drawn in the currently mass-produced 64-Mbits DRAMs. In the photolithography process, a KrF excimer laser light (wavelength=248 nm), which is an ultraviolet ray, is most often used as a light source. With the miniaturization of patterns, further improvements are required also in the dimensional accuracy and the overlay accuracy.

While, generally, shorter exposure wavelengths provide higher-resolution resist patterns, the resolution is coming near to its limit even through the use of the KrF excimer laser. For this, while some resolution enhancement techniques, such as the phase-shifting mask method and the off-axis method, are being suggested to improve the resolution, these methods have almost no effects on isolated patterns, although they are useful in constant pitch patterns.

FIGS. 25 and 26 are process diagrams showing an example of a conventional resist pattern formation method. In this example, first, a commercially available positive resist 52 is applied in a thickness of about 500 nm on a semiconductor substrate 51. Subsequently, pre-baking is performed for 90 seconds at 100° C. The liquid positive resist 52 is thus hardened.

Next, a reticle (photomask) 61 having a pattern with various pitches (wiring pattern, for example) is attached to a stepper using a KrF excimer laser (wavelength=248 nm) 54 as a light source and exposure is performed. As a result, the pattern drawn on the reticle 61 is transferred on the positive resist 52 (see FIG. 25).

Subsequently, a PEB (Post Exposure Baking) is performed at 110° C. for 90 seconds, which is followed by development for 60 seconds using a 2.38 weight percent solution of tetramethylammonium hydroxide (TMAH). As a result, a resist pattern 52b corresponding to the pattern drawn on the reticle 61 is obtained (see FIG. 26).

FIGS. 27 to 29 are graphs showing measurements of characteristics of the conventional resist pattern formation method shown in FIGS. 25 and 26. For illumination conditions, NA (numerical aperture) was set as NA=0.55, and an off-axis method using 2/3ring zone illumination aperture was adopted.

FIG. 27 is a graph showing focus versus resist pattern size in 0.18-μm lines and spaces (a resist pattern with lines arranged at widths and intervals both equal to 0.18 μm). FIG. 28 is a graph showing the focus versus the resist pattern size in a resist pattern with 0.18-μm linewidths and 5.0-μm intervals. A resist pattern in which the intervals are considerably larger than the linewidths is tentatively called isolated line. Here it is referred to as 0.18-μm isolated line.

In FIGS. 27 and 28, the resist pattern size means the width of linear resist pattern formed. The focus means the distance along the shallow focus direction (positive side) and the deep focus direction (negative side) on the basis of the focused position (focus=0). The plurality of curves correspond to different radiation energies, i.e. different radiation times, and the curve with black square marks corresponds to the radiation energy realizing the target resist pattern size (=0.18 μm). The energy sequentially becomes lower by 5% on the curves below the black square mark curve and the energy sequentially becomes higher by 5% on the curves above it.

Assuming that the energy error is tolerated to ±5% and the resist pattern size error is tolerated to ±0.03 μm, then, as shown in FIG. 27, a focus latitude of ±1 μm or larger is obtained with 0.18-μm lines and spaces. On the other hand, with the 0.18-μm isolated lines, as shown in FIG. 28, a focus latitude of only about ±0.3 μm can be obtained under the same tolerance conditions.

FIG. 29 shows the resist pattern size with respect to various intervals (spaces) in a resist pattern whose target linewidth is 0.18 μm. As shown in FIG. 29, errors of about 0.04 μm to 0.05 μm occur in the resist pattern size as the space varies. On the other hand, in the gate process requiring the highest dimensional accuracy in the semiconductor processes, i.e. in the process of patterning the gates of MOS transistors, accuracy within about 0.02 μm is required with respect to the design dimensions of the MOS transistors.

Further, severer dimensional accuracy will be required as the miniaturization of patterns further advances in the future.

As described above, the conventional resist pattern formation method had the problem that ensuring the process latitude is not easy in semiconductor integrated circuits which will require higher dimensional accuracy in the future. Particularly, securing the focus latitude is especially difficult with isolated lines, and it is also difficult to control the dimensions (widths) varying depending on the intervals between adjacent parts of patterns.

SUMMARY OF THE INVENTION

A first aspect of the present invention is directed to a method for forming a resist pattern with a resist formed on a substrate and containing a polymer which is denatured by a first given component and a denaturing agent which generates the first given component on exposure to radiation. According to the present invention, the resist pattern forming method comprises the steps of: (a) performing a first exposure with a given pattern; (b) performing a development for the first exposure; (c) after the step (b), supplying the denaturing agent to cover the resist; (d) after the step (c), performing a second exposure with a pattern which is rougher than the given pattern; and (e) performing a development for the second exposure.

Preferably, according to a second aspect of the invention, in the resist pattern forming method, the polymer comprises a substituent which is decomposed by the first given component (e.g. acid).

Preferably, according to a third aspect of the invention, in the resist pattern forming method, the first given component is a cross-linking component, and the denaturing agent comprises a first component (e.g. an acid generator) which generates an agent (e.g. acid) on the exposure and a second component (e.g. a crosslinking agent) forced to generate the cross-linking component by the agent, wherein the polymer is cross-linked by the cross-linking component.

Preferably, according to a fourth aspect of the invention, in the resist pattern forming method, the polymer is cross-linked by a second given component (e.g. a cross-linking component), and in the step (c), a third given component (e.g. a crosslinking agent) forced to generate the second given component by the first given component is also supplied.

A fifth aspect of the present invention is directed to a method for forming a resist pattern with a resist formed on a substrate and comprising a polymer having a substituent, which is decomposed by a first given component, and cross-linked by ultraviolet radiation and heating, and a denaturing agent which generates the first given component on exposure. According to the present invention, the resist pattern forming method comprises the steps of: (a) performing a first exposure with a given pattern; (b) performing a development for the first exposure; (c) after the step (b), performing a second exposure with a pattern which is rougher than the given pattern; (d) after the step (c), simultaneously applying ultraviolet radiation and heat; and (e) performing a development for the ultraviolet radiation.

According to the method of the first aspect, a pattern is once formed in the steps (a) and (b) with a given pattern which can precisely be formed, and then an exposure is performed in the step (d) with a pattern rougher than the given pattern, so that the pattern formed in the step (e) can be highly accurate in the part including the given pattern. Moreover, since a denaturing agent is supplied again in the step (c), the method has the effect that the sensitivity of the resist to exposure can be enhanced in the second exposure, which was not presented by Japanese Patent Laying-Open No.8-17703.

According to the second aspect, the resist becomes susceptible to development in exposed areas by the action of the given component, so that a positive resist pattern can be formed.

According to the third aspect, the resist becomes unsusceptible to development in exposed areas by the action of the given component, so that a negative resist pattern can be formed.

According to the fourth aspect, in the second exposure, the resist becomes unsusceptible to development in exposed areas by the action of the second given component, so that a negative resist pattern can be formed.

According to the fifth aspect, ultraviolet radiation and heat are applied after the second exposure, so that the polymer is cross-linked in unexposed areas and the resist becomes unsusceptible to development. Accordingly, a positive resist pattern can be formed in both of the first and second exposures.

The present invention has been made to solve the above-described problems in the conventional art, and an object of the present invention is to obtain a resist pattern formation method which is capable of enhancing the focus latitude and suppressing variations of widths due to different intervals in resist patterns.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
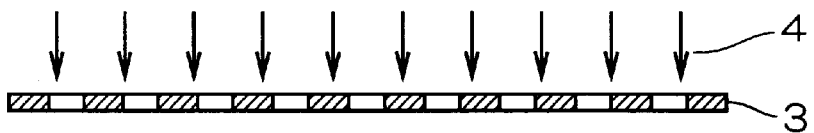
FIGS. 1 to 4 are process diagrams showing a method according to a first preferred embodiment.

FIGS. 1 to 4 are process diagrams showing a method for forming a resist pattern according to a first preferred embodiment. In this example, a resist pattern is formed for the purpose of forming wiring with 0.18-μm widths at various intervals on a semiconductor substrate. In this method, the process shown in FIG. 1 is carried out first. In the process shown in FIG. 1, a substrate 1 is prepared first. The substrate 1 is a semiconductor substrate which is in the process just before the formation of wiring in the semiconductor process sequence, and a wiring material is deposited on its main surface. Subsequently, a commercially available positive resist 2 is applied on the main surface of the substrate 1 in a thickness of about 500 nm.

Figure 5:
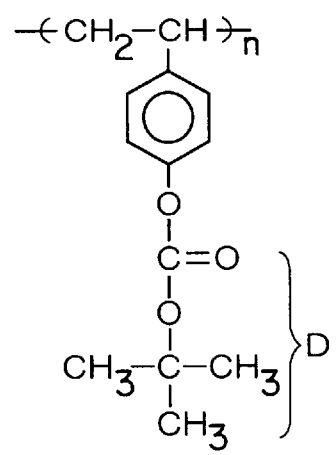
FIG. 5 is an explanation diagram showing an example of a base resin of the positive resist.
Figure 6:
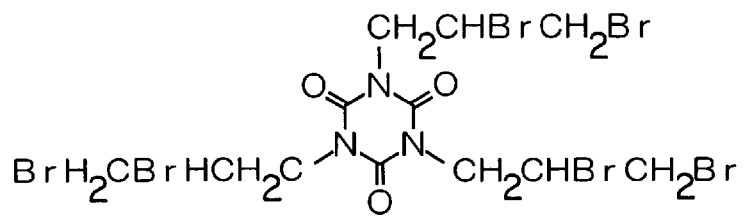
FIG. 6 is an explanation diagram showing an example of an acid generator.

The positive resist 2 contains the polymer shown in FIG. 5 as a base resin, for example. This polymer has a substituent D which is decomposed by the action of acid (e.g. proton). More specifically, a large number of units linked along the main chain of the polymer includes units having the substituent D as shown in FIG. 5 and units having no substituent D at a certain ratio. The positive resist 2 also contains an acid generator and an organic solvent (so-called thinner). FIG. 6 shows N, N, N-tris (2, 3-dibromopropyl isocyanurate) as an example of the acid generator. The organic solvent keeps the positive resist 2 in liquid form by dissolving the base resin and acid generator.

Referring to FIG. 1 again, the application of the positive resist 2 on the substrate 1 is followed by prebaking at 100° C. for 90 seconds. Then the organic solvent contained in the positive resist 2 evaporates and the positive resist 2 is hardened. Subsequently, a photomask 3 having a mask pattern for transferring a 0.18-μm line-and-space pattern onto the positive resist 2 is attached to a stepper (not shown).

Then, an exposure (first exposure) is carried out by using a KrF excimer laser (wavelength=248 nm) 4 as a light source. Specifically, the light of the KrF excimer laser 4 transmitted through the mask pattern drawn on the photomask 3 is projected onto the positive resist 2 on a reduced scale. In the positive resist 2, the acid generator generates acid (e.g. proton) in areas exposed to the light of the KrF excimer laser 4. That is to say, acid is selectively generated in the positive resist 2 in the form of the pattern corresponding to the mask pattern.

Figure 7:
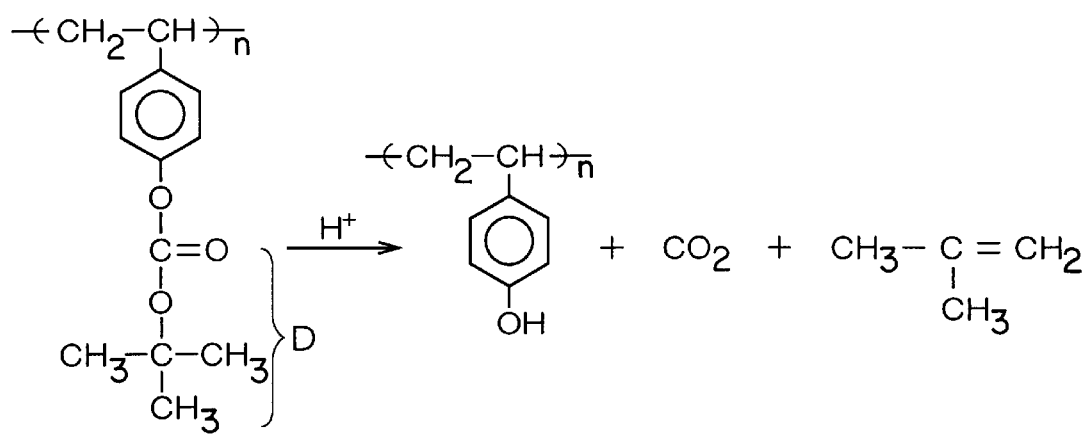
FIG. 7 is an explanation diagram showing modification of the base resin of the positive resist.

Next, PEB (Post Exposure Baking) is performed at 110° C. for 90 seconds. Then, as shown in FIG. 7, the substituent D in the base resin contained in the positive resist 2 is cut off from the main chain of the polymer by the action of the acid (e.g. proton). The decomposition of the substituent D selectively occurs in the areas in which the acid was generated by the exposure. That is to say, the base resin is denatured selectively in the form corresponding to the mask pattern.

Figure 2:
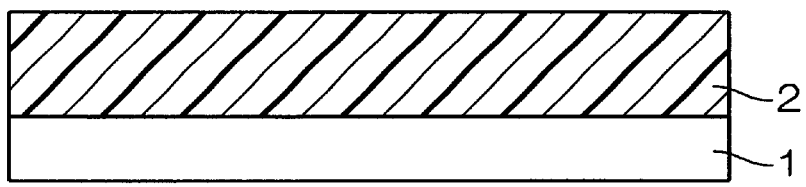

Subsequently, it is developed for 60 seconds by using a 2.38 weight percent solution of tetramethylammonium hydroxide (TMAH) as a developer. This alkaline developer selectively acts on the 'OH group' shown in FIG. 7. Accordingly the areas in which the base resin was denatured easily dissolve in the developer and other areas remain without dissolving. Specifically, the exposed areas in the positive resist 2 are selectively removed. As a result, as shown in FIG. 2, the positive resist 2 is patterned into a 0.18-μm line-and-space pattern corresponding to the mask pattern. In other words, the resist pattern 2a is obtained in the form patterned into lines arranged at widths and intervals both equal to 0.18 μm.

Figure 3:
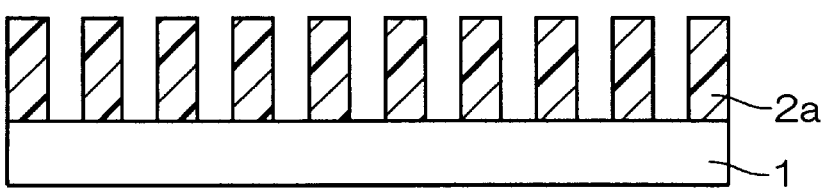

Next, the process shown in FIG. 3 is performed. In the process shown in FIG. 3, first, a resin 6 is applied on the substrate 1 to cover the resist pattern 2a. The resin 6 contains an acid generator. Subsequently, it is baked at 100° C. for 90 seconds. Then unwanted liquid contained in the resin 6 evaporates and the acid generator in the resin 6 penetrates into the resist pattern 2a.

Subsequently, a photomask 5 is attached to the stepper (not shown), on which a mask pattern is formed to selectively expose unwanted areas in the resist pattern 2a formed as lines. Then, an exposure (second exposure) is performed with a light source 4a. As a result, in the resist pattern 2a, the acid generator generates acid in areas exposed to the light from the light source 4a. The KrF excimer laser 4 is used as the light source 4a, for example.

Next, PEB is performed at 110° C. for 90 seconds. Then, as shown in FIG. 7, the substituent D in the base resin contained in the resist pattern 2a is cut off from the main chain of the polymer by the action of the acid. That is to say, the base resin in the resist pattern 2a is selectively denatured in the form corresponding to the mask pattern drawn on the photomask 5.

Figure 4:
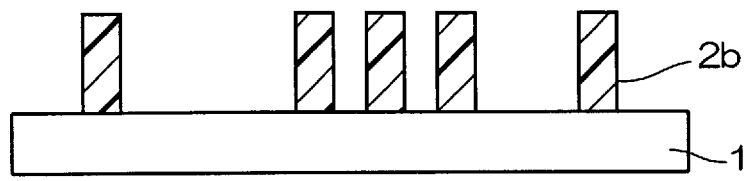

Subsequently, a development is performed for 60 seconds by using a 2.38 weight percent solution of TMAH as a developer. As a result, as shown in FIG. 4, part of the resist pattern 2a (the denatured areas) is selectively removed in correspondence with the mask pattern drawn on the photomask 5 and a desired resist pattern 2b is thus obtained.

As the acid generator contained in the resin 6, triphenylsulfonium salt widely used for the KrF excimer laser, or N, N, N-tris (2, 3-dibromopropyl isocyanurate) (FIG. 6), is adopted, for example. The resin 6 is an aqueous solution in which the acid generator is mixed with water-soluble resin such as polyvinyl alcohol, polyvinylpyrrolidone, polyacrylic acid, etc.

In the second exposure, the resist pattern to be formed may not be as minute as that in the first exposure. In this case, in the second exposure, an i-line stepper may be used in place of the KrF excimer laser 4, for example. In this case, phenylnaphthylamine may be mixed as a sensitizer in the resin 6, or an acid generator having sensitivity to i-line (e.g. chloromethyltriazine) may be used as the acid generator.

As described above, the resist pattern formation method of the first preferred embodiment allows large focus latitude, and it provides the resist pattern 2b in desired form by first forming the resist pattern 2a in line-and-space form (arranged lines) with A equal widths and equal intervals, whose widths can precisely be controlled, and then selectively removing unwanted lines in the resist pattern 2a. Accordingly, the widths in the resist pattern 2b are kept equal to the widths in the original resist pattern 2a. That is to say, the resist pattern 2b can be formed with wide focus latitude and with highly accurate widths independent of the intervals.

Furthermore, the concentration of the acid generator contained in the positive resist 2 cannot be made very high, since an adequate balance must be maintained with other characteristics required for the positive resist 2. That is to say, the photosensitivity of the commercially available positive resist 2 has a given limitation. However, in the resist pattern formation method of the first preferred embodiment, the resin 6 containing an acid generator is supplied for the second exposure, so that the photosensitivity of the resist pattern 2a can be increased over the limit in the second exposure.

Second Preferred Embodiment

Figure 8:
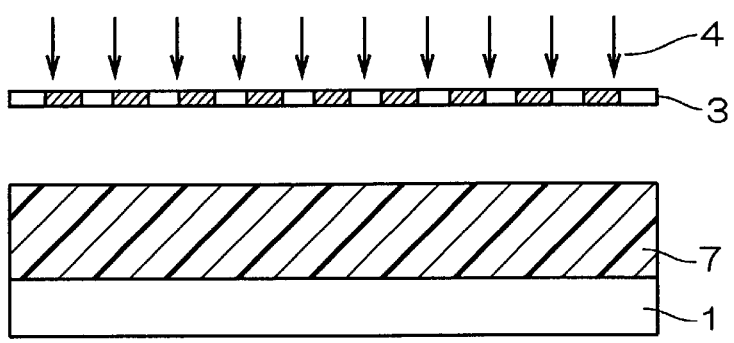
FIGS. 8 to 11 are process diagrams showing a method according to a second preferred embodiment.

FIGS. 8 to 11 are process diagrams showing a method for forming a resist pattern according to a second preferred embodiment. Also in this example, a resist pattern is formed for the purpose of forming wiring with 0.18-μm widths and at various intervals on a semiconductor substrate. In this method, the process shown in FIG. 8 is first conducted. In the process of FIG. 8, first, the substrate 1 described in the first preferred embodiment is prepared. Subsequently, a commercially available negative resist 7 is applied in a thickness of about 500 nm on the main surface of the substrate 1.

Figure 12:
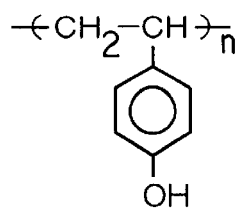
FIG. 12 is an explanation diagram showing an example of a base resin of the negative resist.
Figure 13:
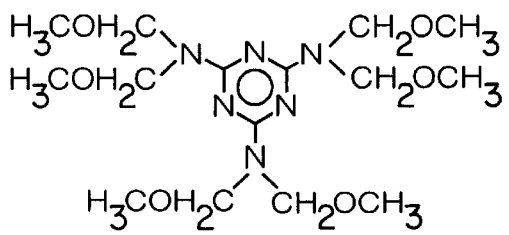
FIG. 13 is an explanation diagram showing an example of a crosslinking agent.

The negative resist 7 contains the polymer shown in FIG. 12 as a base resin, for example. This polymer is polyvinylphenol resin. The negative resist 7 also contains an acid generator, a crosslinking agent, and an organic solvent (so-called thinner). As the acid generator, N, N, N-tris (2, 3-dibromopropyl isocyanurate) shown in FIG. 6 is used, for example. As the crosslinking agent, hexamethoxymethyl melamine shown in FIG. 13 is used, for example. The organic solvent keeps the negative resist 7 in liquid form by dissolving the base resin, acid generator, and crosslinking agent.

Referring to FIG. 8 again, the application of the negative resist 7 on the substrate 1 is followed by prebaking at 100° C. for 90 seconds. Then the organic solvent contained in the negative resist 7 evaporates and the negative resist 7 is hardened. Subsequently, a photomask 3 having a mask pattern for transferring a 0.18-μm line-and-space pattern onto the negative resist 7 is attached to a stepper (not shown).

Then, an exposure (first exposure) is carried out by using a KrF excimer laser 4 as a light source. That is to say, the light of the KrF excimer laser 4 transmitted through the mask pattern drawn on the photomask 3 is projected onto the negative resist 7 on a reduced scale. In the negative resist 7, the acid generator generates acid (e.g. proton) in areas exposed to the light of the KrF excimer laser 4. In other words, acid is selectively generated in the negative resist 7 in the form of pattern corresponding to the mask pattern.

Figure 14:
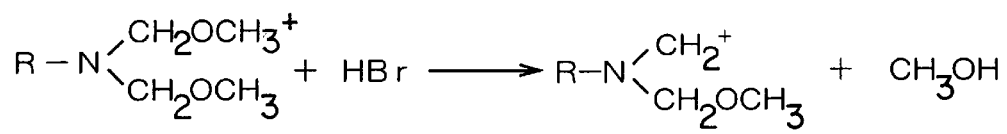
FIG. 14 is an explanation diagram showing modification of the base resin of the negative resist.
Figure 14:
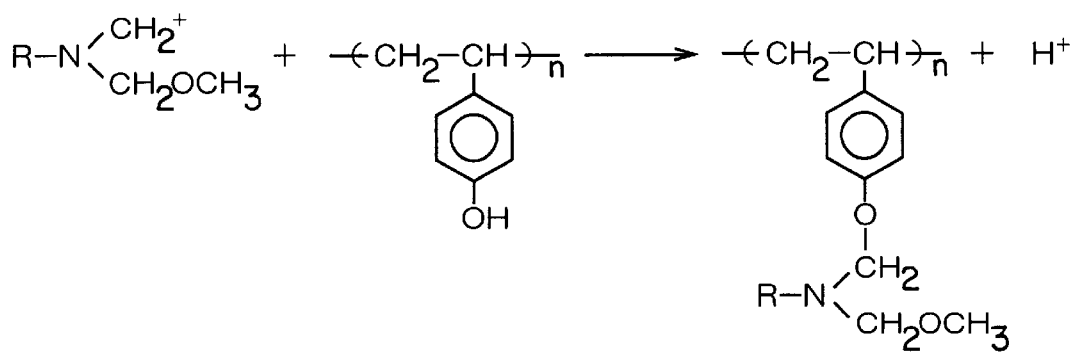

Next, PEB is performed at 110° C. for 90 seconds. Then, as shown in FIG. 14, acid (HBr) acts on the crosslinking agent (the substance of FIG. 13 is shown as an example), and part of it is dissociated. Then, the denatured crosslinking agent acts, on the base resin (the substance of FIG. 12 is shown as an example), so that a large number of main chains of the base resin are linked with each other through the crosslinking agent. That is to say, a cross-linking reaction is caused. The cross-linking reaction selectively takes place in the areas in which acid was generated in the exposure. Accordingly, the base resin is denatured selectively in the form corresponding to the mask pattern.

Figure 9:
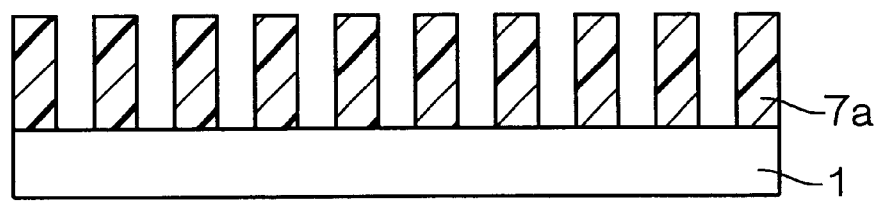

Subsequently, it is developed for 60 seconds by using a 2.38 weight percent solution of tetramethylammonium hydroxide (TMAH) as a developer. This alkaline developer selectively acts on the 'OH group' shown in FIG. 14. Accordingly the areas in which cross-linking reaction took place in the base resin remain without dissolving in the developer and the other areas easily dissolve. That is to say, unexposed areas in the negative resist 7 are selectively removed. As a result, as shown in FIG. 9, the negative resist 7 is patterned into a 0.18-μm line-and-space pattern corresponding to the mask pattern. In other words, the resist pattern 7a is obtained in the form patterned into lines arranged at widths and intervals both equal to 0.18 μm.

Figure 10:
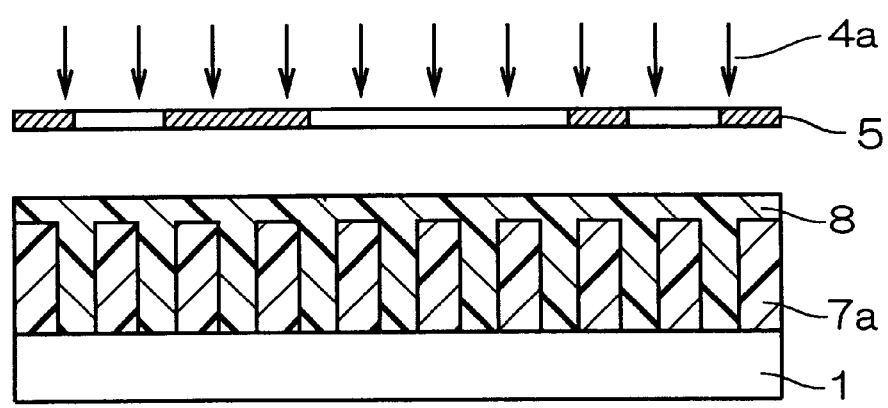

Next, the process shown in FIG. 10 is performed. In the process shown in FIG. 10, first, a resin 8 is applied on the substrate 1 to cover the resist pattern 7a. The resin 8 contains a crosslinking agent and an acid generator. Subsequently, it is baked at 100° C. for 90 seconds. Thus unwanted liquid contained in the resin 8 evaporates and the crosslinking agent and the acid generator in the resin 8 penetrate into the resist pattern 7a.

Subsequently, a photomask 5 is attached to the stepper (not shown), on which a mask pattern is formed to selectively expose wanted areas in the resist pattern 7a formed as lines. Then, an exposure (second exposure) is performed with a light source 4a. As result, in the resist pattern 7a, the acid generator generates acid in the areas exposed to the light from the light source 4a. The KrF excimer laser 4 is used as the light source 4a, for example.

Next, PEB is performed at 110° C. for 90 seconds. Then, as shown in FIG. 14, a cross-linking reaction is caused in the base resin contained in the resist pattern 7a. That is to say, the base resin in the resist pattern 7a is selectively denatured in the form corresponding to the mask pattern drawn on the photomask 5.

Figure 11:
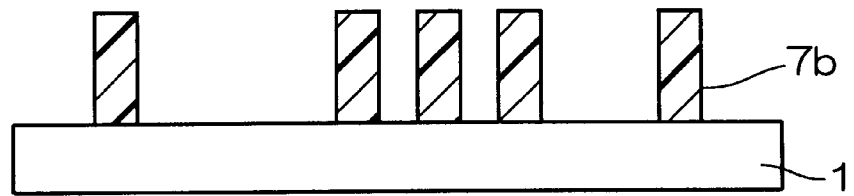

Subsequently, a development is performed for 60 seconds by using organic solvent, such as butyl acetate or isoamyl acetate, as a developer. The organic developer selectively dissolves the uncrosslinked areas, without acting on the crosslinked areas. As a result, as shown in FIG. 11, part of the resist pattern 7a is selectively removed in correspondence with the mask pattern drawn on the photomask 5 and a desired resist pattern 7b is thus obtained.

As the acid generator contained in the resin 8, triphenylsulfonium salt widely used for the KrF excimer laser, or N, N, N-tris (2, 3-dibromopropyl isocyanurate) (FIG. 6), is adopted, for example. As the crosslinking agent contained in the resin 8, hexamethoxymethyl melamine (FIG. 13) is adopted, for example. The resin 8 is an aqueous solution in which the acid generator and the crosslinking agent are mixed with water-soluble resin such as polyvinyl alcohol, polyvinylpyrrolidone, polyacrylic acid, etc.

In the second exposure, the resist pattern to be formed may not be as minute as that in the first exposure. In this case, in the second exposure, an i-line stepper may be used in place of the KrF excimer laser 4, for example. In this case, phenylnaphthylamine may be mixed as a sensitizer in the resin 8, or an acid generator having sensitivity to i-line (e.g. chloromethyltriazine) may be used as the acid generator.

As the developer used after the first exposure, an organic developer may be used in place of the alkaline developer. As the developer used after the second exposure, an alkaline developer may be used in place of an organic developer. However, to form fine patterns, the use of alkaline developer is more desired, and an organic developer satisfactorily functions to form less minute patterns.

As described above, also in the resist pattern formation method of the second preferred embodiment, the resist pattern 7a is once formed in a line-and-space form (arranged lines) with equal widths and equal intervals and then unwanted lines in the resist pattern 7a are selectively removed, so that the resist pattern 7b is obtained in desired form. Further, the resin 8 containing an acid generator and a crosslinking agent is supplied for the second exposure. The method of the second preferred embodiment therefore provides the same advantage as the first preferred embodiment.

Third Preferred Embodiment

Figure 15:
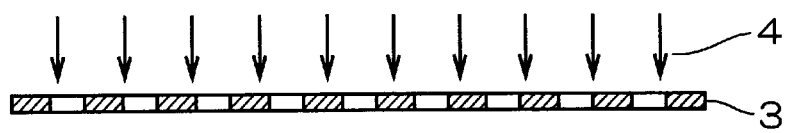
FIGS. 15 to 18 are process diagrams showing a method according to a third preferred embodiment.
Figure 15:
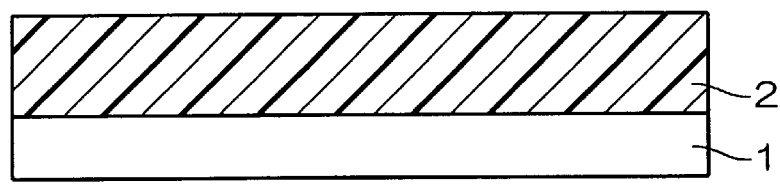

FIGS. 15 to 18 are process diagrams showing a method for forming a resist pattern according to a third preferred embodiment. Also in this example, a resist pattern is formed for the purpose of forming wiring with 0.18-μm widths at various intervals on a semiconductor substrate. In this method, the process shown in FIG. 15 is carried out first. In the process shown in FIG. 15, the substrate 1 described in the first preferred embodiment is prepared first. Subsequently, the positive resist 2 described in the first preferred embodiment is applied on the main surface of the substrate 1 to a thickness of about 500 nm.

Subsequently, a prebaking is performed at 100° C. for 90 seconds. Thus the positive resist 2 is hardened. Next, a photomask 3 having a mask pattern for transferring a 0.18-μm line-and-space pattern onto the positive resist 2 is attached to a stepper (not shown). Then, an exposure (first exposure) is carried out by using a KrF excimer laser 4 as a light source. This is followed by PEB at 110° C. for 90 seconds.

Figure 16:
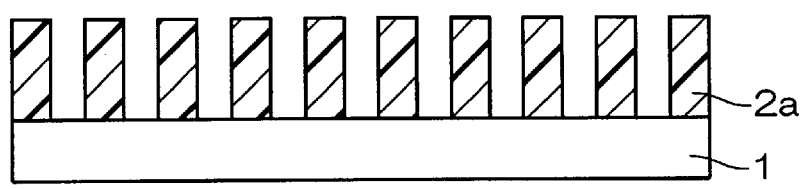

Next, it is developed for 60 seconds by using a 2.38 weight percent solution of TMAH as a developer. As a result, as shown in FIG. 16, the positive resist 2 is patterned into a 0.18-μm line-and-space pattern corresponding to the mask pattern. That is to say, the resist pattern 2a s obtained in the form patterned into lines arranged at widths and intervals both equal to 0.18 μm.

Figure 17:
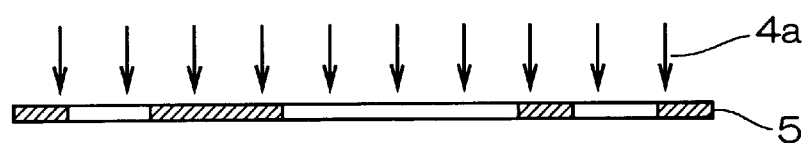
Figure 17:
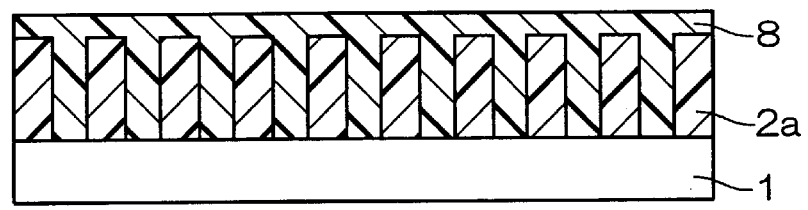

Next, the process shown in FIG. 17 is performed. In the process shown in FIG. 17, first, the resin 8 described in the second preferred embodiment is applied on the substrate 1 to cover the resist pattern 2a. Subsequently, it is baked at 100° C. for 90 seconds, which causes the crosslinking agent and the acid generator in the resin 8 to penetrate into the resist pattern 2a.

Subsequently, a photomask 5 is attached to the stepper (not shown), on which a mask pattern is formed to selectively expose wanted areas in the resist pattern 2a formed as lines. Then, an exposure (second exposure) is performed with a light source 4a. As a result, in the resist pattern 2a, the acid generator generates acid in the areas exposed to the light from the light source 4a. The KrF excimer laser 4 is used as the light source 4a, for example.

Next, PEB is performed at 110° C. for 90 seconds. This causes a cross-liking reaction in the base resin contained in the resist pattern 2a. That is to say, the base resin in the resist pattern 2a is selectively modified in the form corresponding to the mask pattern drawn on the photomask 5. The crosslinking reaction is shown in FIG. 14.

While the resist pattern 2a is a positive resist, not only units having the substituent D but also units having no substituent D are linked to the main chain of the base resin in the positive resist, as described in the first preferred embodiment. As shown in FIG. 14, the cross-linking reaction proceeds in the units having no substituent D. In the areas exposed to the light of the light source 4a, the substituent D is decomposed by the action of the acid generator in a certain portion of the units having the substituent D. The cross-linking reaction shown in FIG. 14 proceeds in the same way also in the units in which the substituent D was decomposed.

Figure 18:
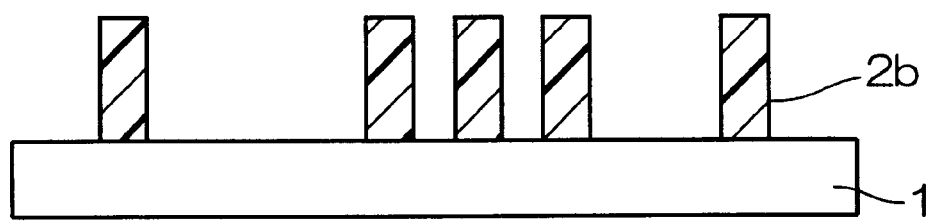

Subsequently, a development is performed for 60 seconds by using organic solvent, such as butyl acetate or isoamyl acetate, as a developer. As a result, as shown in FIG. 18, part of the resist pattern 2a is selectively removed in correspondence with the mask pattern drawn on the photomask 5 and a desired resist pattern 2b is thus obtained.

The examples shown as the acid generator in the second preferred embodiment can be contained in the resin 8. Also, when the resist pattern to be formed in the second exposure is not as minute as that in the first exposure, the examples shown in the second preferred embodiment can be adopted in this preferred embodiment.

As described above, in the resist pattern formation method of the third preferred embodiment, the resist pattern 2a is once formed in a line-and-space form (arranged lines) with equal widths and equal intervals and then unwanted lines in the resist pattern 2a are selectively removed, so that the resist pattern 2b is obtained in desired form. Further, the resin 8 containing an acid generator and a crosslinking agent is supplied for the second exposure. The method of the third preferred embodiment therefore provides the same advantage as the first and second preferred embodiments.

Fourth Preferred Embodiment

Figure 19:
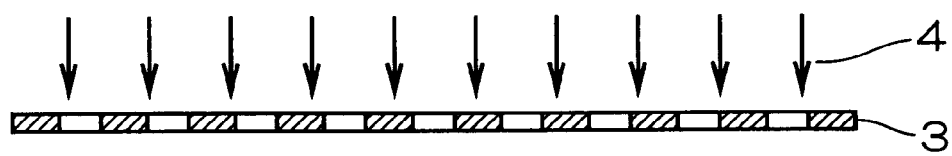
FIGS. 19 to 23 are process diagrams showing a method according to a fourth preferred embodiment.
Figure 19:
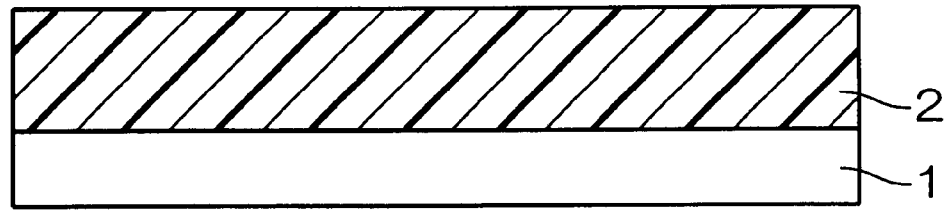

FIGS. 19 to 23 are process diagrams showing a method for forming a resist pattern according to a fourth preferred embodiment. Also in this example, a resist pattern is formed for the purpose of forming wiring with 0.18-μm widths at various intervals on a semiconductor substrate. In this method, the process shown in FIG. 19 is carried out first. In the process shown in FIG. 19, the substrate 1 described in the first preferred embodiment is prepared first. Subsequently, the positive resist 2 described in the first preferred embodiment is applied on the main surface of the substrate 1 in a thickness of about 500 nm.

Subsequently, a prebaking is performed at 100° C. for 90 seconds. Thus the positive resist 2 is hardened. Next, a photomask 3 having a mask pattern for transferring a 0.18-μm line-and-space pattern onto the positive resist 2 is attached to a stepper (not shown). Then, an exposure (first exposure) is carried out by using the KrF excimer laser 4 as a light source. This is followed by PEB at 110° C. for 90 seconds.

Figure 20:
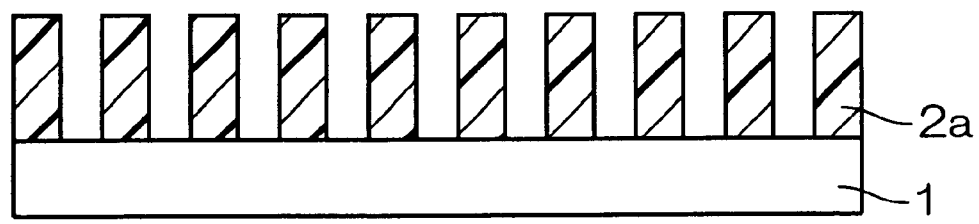

Next, it is developed for 60 seconds by using a 2.38 weight percent solution of TMAH as a developer. As a result, as shown in FIG. 20, the positive resist 2 is patterned into a 0.18-μm line-and-space pattern corresponding to the mask pattern. That is to say, the resist pattern 2a is obtained in the form patterned into lines arranged at widths and intervals both equal to 0.18 μm.

Figure 21:
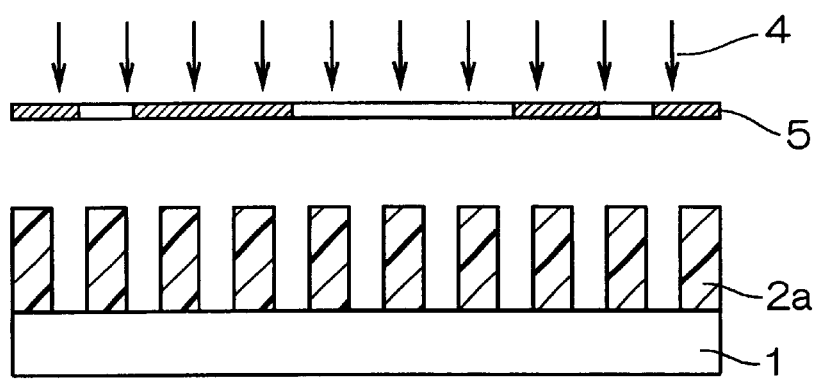

Next, the process shown in FIG. 21 is carried out. In the process of FIG. 21, a photomask 5 is attached to the stepper (not shown), on which a mask pattern is formed to selectively expose wanted areas in the resist pattern 2a formed as lines. Then, an exposure (second exposure) is performed with the KrF excimer laser 4. As a result, in the resist pattern 2a, the acid generator generates acid in areas exposed to the light of the KrF excimer laser 4.

Figure 22:
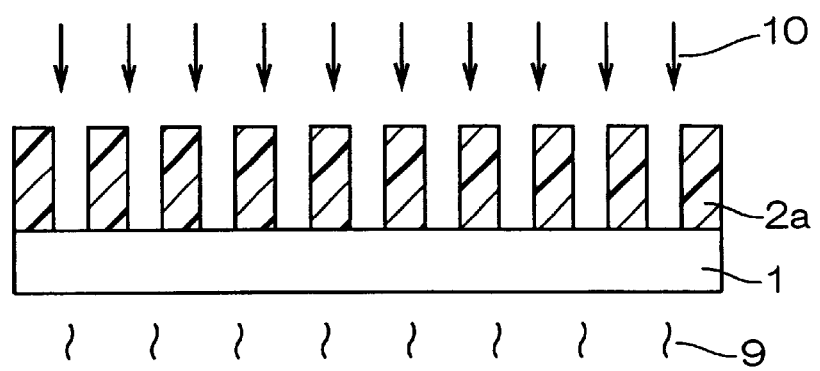
Figure 24:
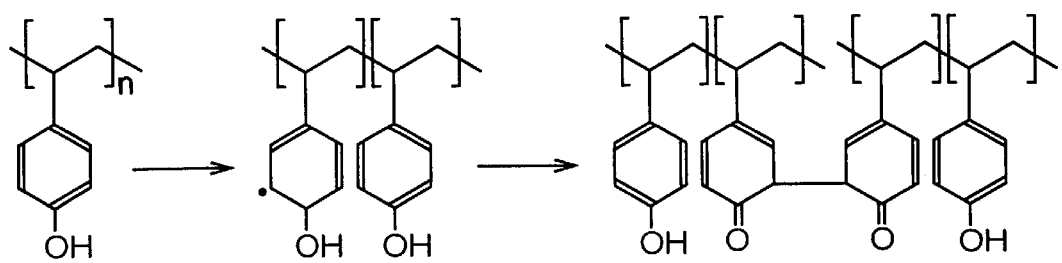
FIG. 24 is an explanation diagram showing a cross-linking reaction by deep-UV cure.
Figure 25:
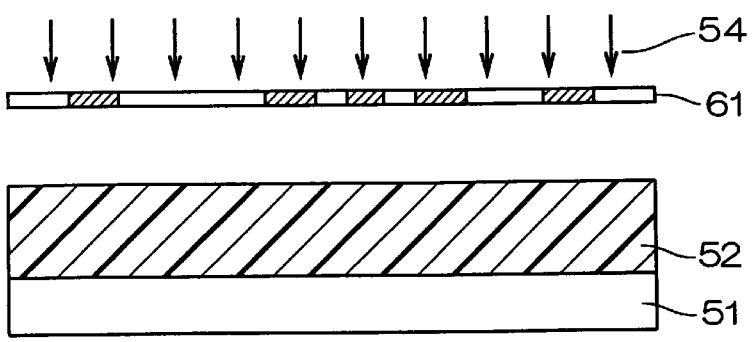
FIGS. 25 and 26 are process diagrams showing a conventional method.
Figure 26:
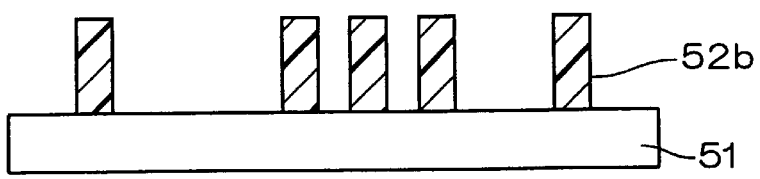
Figure 27:
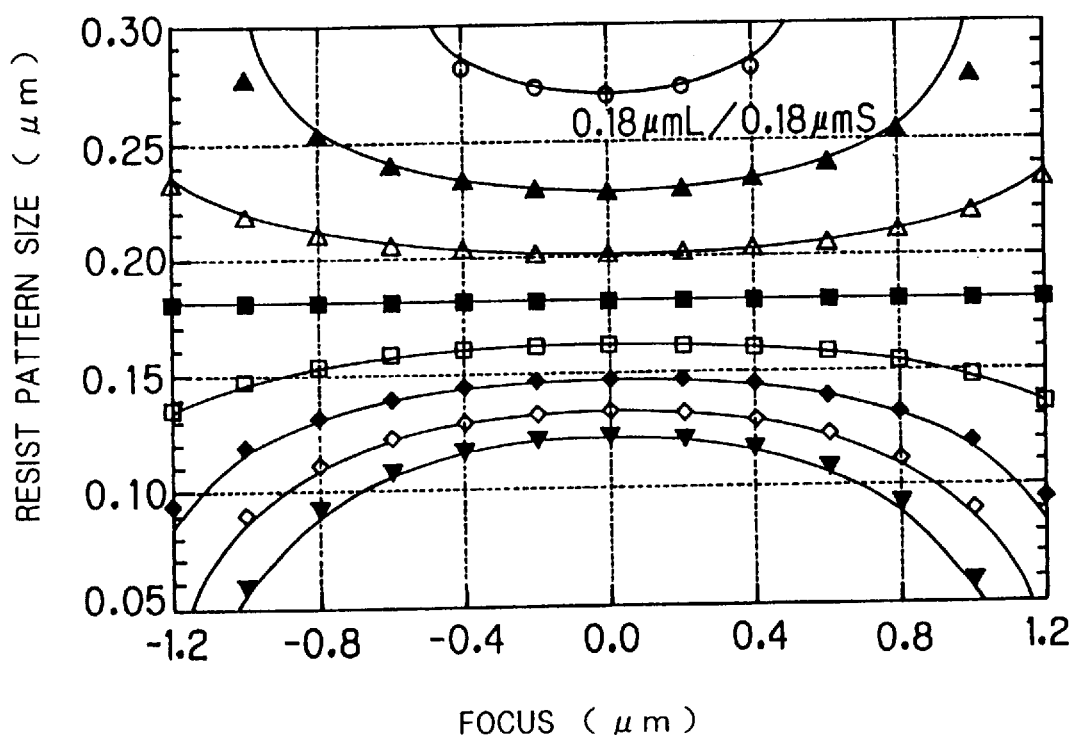
FIGS. 27 to 29 are graphs showing characteristics of the conventional method.
Figure 28:
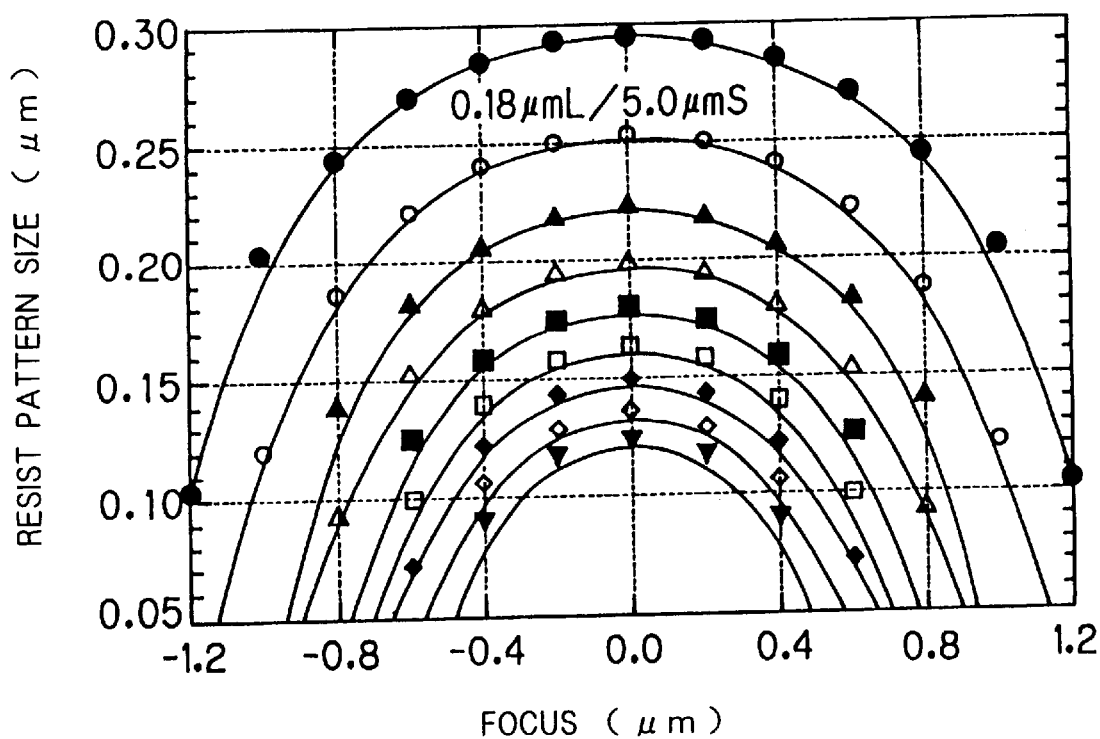
Figure 29:
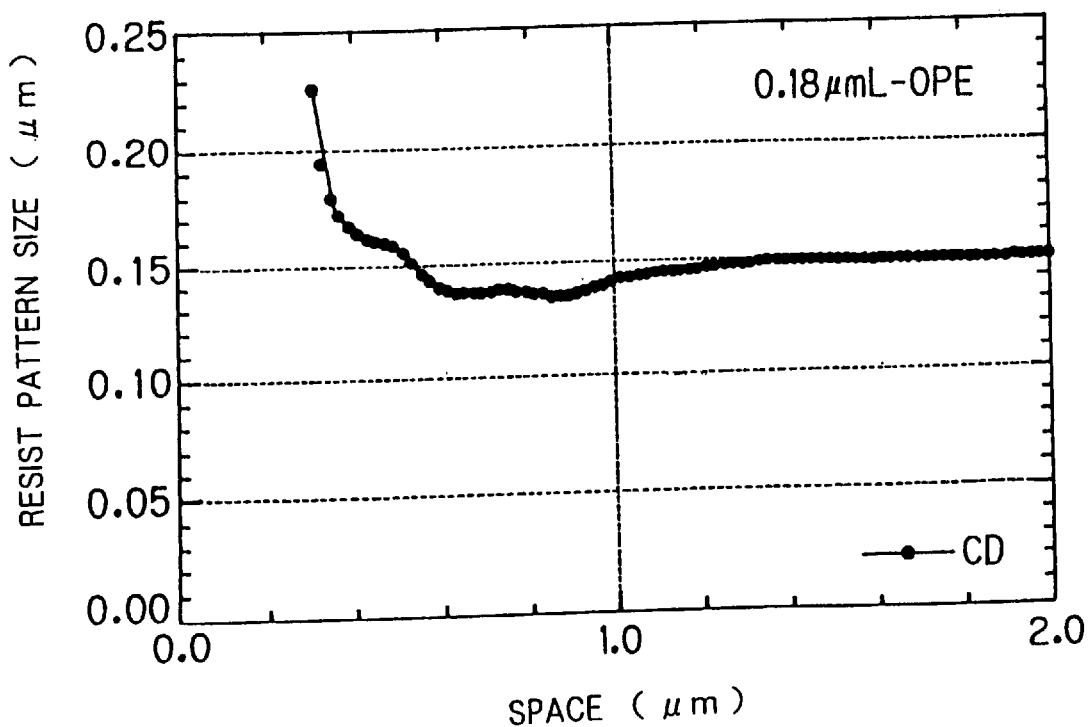

Next, the process shown in FIG. 22 is carried out. In the process of FIG. 22, first, a deep-UV cure is performed by using ultraviolet radiation 10 while applying heat 9 to the substrate 1 (and the resist pattern 2a). At this time, as shown in FIG. 24, the base resin is oxidized by the irradiation of the ultraviolet radiation 10, and cross-linking reaction progresses by the heat in the oxidized areas. Since decomposition of the substituents progresses by the action of the acid generator in the areas exposed to the light of the KrF excimer laser 4 in the process of FIG. 21, the cross-linking reaction is selectively promoted. That is to say, the cross-linking reaction is selectively promoted in the areas exposed to the light of the KrF excimer laser 4 in the resist pattern 2a.

Figure 23:
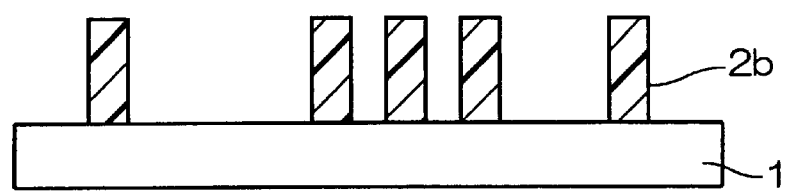

Subsequently, a development is performed for 60 seconds by using organic solvent, such as butyl acetate or isoamyl acetate, as a developer. At this time, in the resist pattern 2a, the areas in which cross-linking reaction took place remain without dissolving in the developer and other areas easily dissolve. As a result, as shown in FIG. 23, part of the resist pattern 2a is selectively removed in correspondence with the mask pattern drawn on the photomask 5 and a desired resist pattern 2b is thus obtained.

In the second exposure shown in FIG. 21, the resist pattern to be formed may not be as minute as that in the first exposure shown in FIG. 19. In this case, an i-line stepper may be used in the second exposure in place of the KrF excimer laser 4, for example.

As described above, also in the resist pattern formation method of the fourth preferred embodiment, the resist pattern 2a is once formed in a line-and-space form (arranged lines) with equal widths and equal intervals and then unwanted lines in the resist pattern 2a are selectively removed, so that the resist pattern 2b is obtained in desired form. Accordingly, the resist pattern 2b can be formed with wide focus latitude and with highly precise widths independent of the intervals.

First Modification

Although the above-described preferred embodiments have shown examples in which the substrate 1 is a semiconductor substrate, the substrate 1 is not limited to a semiconductor substrate. It may be any substrate as an underlying layer on which the resist pattern 2b or 7b is to be formed. For example, the substrate 1 may be a glass substrate for LCD on which thin-film transistors are fabricated.

Second Modification

The resist patterns 2a and 7a formed in the first exposure were formed as lines arranged at equal widths and equal intervals in the preferred embodiments described above. However, even with unequal widths and unequal intervals, the rougher resist patterns 2b and 7b can be formed by forming the resist pattern 2a or 7a as a minute pattern by using a minute mask pattern in the first exposure and then removing part of the resist pattern 2a or 7a by using a rougher mask pattern in the second exposure. However, the precision of the resist patterns 2a and 7a can be maximized with equal widths and equal intervals.

While the present invention has been described in detail, the foregoing description is in all aspects illustrative and not restrictive. It is understood that numerous other modifications and variations can be devised without departing from the scope of the invention.

What is claimed is:

1. A method for forming a desired resist pattern with a resist formed on a substrate and comprising a polymer which is denatured by a first given component and a denaturing agent which generates said first given component on exposure to radiation, comprising the steps of:

(a) performing a first exposure of the resist formed on the substrate with a given mask pattern;

(b) performing a development for said first exposure to obtain a first resist pattern;

(c) after said step (b), supplying said denaturing agent to cover the resist of the first resist pattern;

(d) after said step (c), performing a second exposure with a mask pattern which is rougher than said given pattern; and (e) performing a development for said second exposure, thereby removing portions of the first resist pattern to form the desired resist pattern.

2. The resist pattern forming method according to claim 1, wherein
said given pattern has a line-and-space form with equal widths and equal intervals.

3. The resist pattern forming method according to claim 1, wherein said polymer comprises a substituent which is decomposed by said first given component.

4. The resist pattern forming method according to claim 3, wherein
said first given component is an acid.

5. The resist pattern forming method according to claim 1, wherein said first given component is a cross-linking component, and
said denaturing agent comprises
a first component which generates an agent on said exposure, and
a second component forced to generate said cross-linking component by said agent,
and wherein said polymer is cross-linked by said cross-linking component.

6. The resist pattern forming method according to claim 5, wherein
said agent is an acid,
said first component is an acid generator, and
said second component is a cross-linking agent.

7. The resist pattern forming method according to claim 3, wherein said polymer is cross-linked by a second given component, and
in said step (c), a third given component forced to generate said second given component by said first given component is also supplied.

8. The resist pattern forming method according to claim 7, wherein
said first given component is an acid,
said second given component is a cross-linking component, and
said third given component is a cross-linking agent.

9. The resist pattern method according to claim 1, wherein the development (b) produces a positive resist pattern.

10. A method for forming a desired resist pattern with a resist formed on a substrate and comprising a polymer having a substituent, which is decomposed by a first given component, and cross-linked by ultraviolet radiation and heating, and a denaturing agent which generates said first given component on exposure to radiation, said method comprising the steps of:

(a) performing a first exposure of the resist formed on the substrate with a given mask pattern;

(b) performing a development for said first exposure to obtain a first resist pattern;

(c) after said step (b), performing a second exposure with a mask pattern which is rougher than said given pattern;

(d) after said step (c), simultaneously applying ultraviolet radiation and heat to the first resist pattern; and (e) performing a development for said ultraviolet radiation, thereby removing portions of the first resist pattern to form the desired resist pattern.

11. The resist pattern forming method according to claim 10, wherein
said given pattern has a line-and-space form with equal widths and equal intervals.

12. The resist pattern forming method according to claim 10, wherein
said first given component is an acid.

* * * * *